(12) United States Patent
Nakanishi et al.

(10) Patent No.: US 8,785,276 B2
(45) Date of Patent: Jul. 22, 2014

(54) METHODS FOR FABRICATING A CELL STRING AND A NON-VOLATILE MEMORY DEVICE INCLUDING THE CELL STRING

(75) Inventors: Toshiro Nakanishi, Seongnam-si (KR); Choong-Man Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 340 days.

(21) Appl. No.: 13/198,143

(22) Filed: Aug. 4, 2011

(65) Prior Publication Data

US 2012/0052672 A1 Mar. 1, 2012

(30) Foreign Application Priority Data

Aug. 25, 2010 (KR) ........................ 10-2010-0082471

(51) Int. Cl.
*H01L 21/336* (2006.01)
*H01L 21/4763* (2006.01)
*H01L 29/792* (2006.01)
*H01L 29/76* (2006.01)

(52) U.S. Cl.
USPC ........... 438/268; 438/270; 438/624; 438/637; 257/324; 257/328; 257/330

(58) Field of Classification Search
USPC ................. 438/259, 268, 270, 624, 637, 795; 257/324, 328, 330
See application file for complete search history.

(56) References Cited

U.S. PATENT DOCUMENTS

2011/0002178 A1* 1/2011 Hwang et al. .......... 365/189.011

FOREIGN PATENT DOCUMENTS

| JP | 2001-274379 | 10/2001 |
| JP | 2009-164485 | 7/2009 |
| JP | 2009-272513 | 11/2009 |
| KR | 10-2009-0098681 A | 9/2009 |

* cited by examiner

*Primary Examiner* — Hsien Ming Lee
(74) *Attorney, Agent, or Firm* — Lee & Morse, P.C.

(57) ABSTRACT

A method for fabricating a cell string includes forming an interlayer dielectric layer, a sacrificial layer, and a semiconductor pattern on a semiconductor substrate, such that the interlayer dielectric layer and the sacrificial layer are formed in a first direction parallel with the semiconductor substrate, and such that the semiconductor pattern is formed in a second direction perpendicular to the semiconductor substrate, forming an opening by patterning the interlayer dielectric layer and the sacrificial layer, filling the opening with a metal, and annealing the semiconductor pattern having the opening filled with the metal.

18 Claims, 15 Drawing Sheets

METHODS FOR FABRICATING A CELL STRING AND A NON-VOLATILE MEMORY DEVICE INCLUDING THE CELL STRING

CROSS-REFERENCE TO RELATED APPLICATION

This application claims priority from Korean Patent Application No. 10-2010-0082471, filed on Aug. 25, 2010, in the Korean Intellectual Property Office, and entitled: "Methods for Fabricating Cell String and Non-Volatile Memory Device Comprising the Cell String," and all the benefits accruing therefrom under 35 U.S.C. 119, the contents of which in its entirety are herein incorporated by reference.

BACKGROUND

1. Field

Example embodiments relate to a method for fabricating a nonvolatile memory device, and more particularly, to a method for fabricating a cell string and a method for fabricating a nonvolatile memory device including the cell string.

2. Description of the Related Art

In order to satisfy consumers' request for superior performance and a lower price, it is necessary to increase integration of a semiconductor memory device. Since an integration of a semiconductor memory device is a main factor in determining a device price, increasing integration is highly requested. In a case of conventional two-dimensional or flat semiconductor memory devices, integration is determined mainly by an area which a unit memory cell occupies, so the integration is greatly affected by a level of technique for forming a fine pattern.

However, since very expensive equipment is needed to obtain a fine pattern, even though integration of two-dimensional semiconductor memory device increases, such an increase is limited. To overcome this limit, a vertical cell string structure for forming a three-dimensional memory cell is being researched.

SUMMARY

Example embodiments provide a method for fabricating a cell string having a low resistance characteristic.

Example embodiments also provide a method for fabricating a nonvolatile memory device having a low resistance characteristic.

These and other features of the example embodiments will be described in or be apparent from the following description of the preferred embodiments.

According to an aspect of the example embodiments, there is provided a method for fabricating a cell string, the method including forming an interlayer dielectric layer, a sacrificial layer, and a semiconductor pattern on a semiconductor substrate, such that the interlayer dielectric layer and the sacrificial layer are formed in a first direction parallel with the semiconductor substrate, and such that the semiconductor pattern is formed in a second direction perpendicular to the semiconductor substrate, forming an opening by patterning the interlayer dielectric layer and the sacrificial layer, filling the opening with a metal, and annealing the semiconductor pattern having the opening filled with the metal.

Filling the opening may include filling the opening with the metal, such that the metal contacts the sacrificial layer to form an interface between the metal and the sacrificial layer.

Forming the sacrificial layer and filling the opening with metal may include using materials such that during annealing a diffusion speed of particles in the sacrificial layer at the interface is higher than that of particles in the metal.

Forming the sacrificial layer may include depositing a material including a silicon (Si) layer, and filling the opening with metal may include depositing aluminum (Al) in the opening.

Annealing may include annealing the semiconductor substrate at a temperature in a range of about 350° C. to about 400° C. for about one hour.

The annealing may include heating a predetermined material of the sacrificial layer and the metal in the opening, such that material particle in the sacrificial layer are substituted with metal particles of the metal.

Forming the interlayer dielectric layer, the sacrificial layer, and the semiconductor pattern may include sequentially stacking a first interlayer dielectric layer, the sacrificial layer, and a second interlayer dielectric layer on the semiconductor substrate in the first direction, and forming the semiconductor pattern in the second direction by patterning the stacked first interlayer dielectric layer, the sacrificial layer, and the second interlayer dielectric layer.

Forming the semiconductor pattern may include forming channel holes by patterning the stacked first interlayer dielectric layer, sacrificial layer, and second interlayer dielectric layer, and forming an ONO layer and the semiconductor pattern in the channel holes.

Forming the interlayer dielectric layer, the sacrificial layer, and the semiconductor pattern may include forming a plurality of interlayer dielectric layers, a plurality of sacrificial layers, and a plurality of semiconductor patterns on the semiconductor substrate, and forming the opening may include forming a plurality of openings by patterning the plurality of interlayer dielectric layers and the plurality of sacrificial layers.

Filling the opening may include filling the plurality of openings with metal to form a plurality of interfaces between the metal and the plurality of sacrificial layers.

Forming the plurality of interfaces between the metal and the plurality of sacrificial layers may include forming aluminum layers through silicon layers.

Forming the plurality of interfaces may include forming the aluminum layers in direct contact with the silicon layers.

The annealing may include annealing the semiconductor substrate at a temperature in a range of about 350° C. to about 400° C. for about one hour.

Forming the plurality of openings may include patterning the plurality of interlayer dielectric layers and the plurality of sacrificial layers stacked between the plurality of semiconductor patterns.

Forming the plurality of openings may include forming openings that extend in parallel in the first direction.

Forming the plurality of openings may include forming a top surface of each of the plurality of the openings to have a same shape as that of each of the plurality of semiconductor patterns.

The method may further include forming an upper insulation layer on the stacked plurality of interlayer dielectric layers, the plurality of sacrificial layers, and the plurality of semiconductor patterns, and forming the plurality of openings may include forming the plurality of openings by patterning the plurality of interlayer dielectric layers, the plurality of sacrificial layers, and the plurality of semiconductor patterns.

The method may further include implanting impurity having a different conductivity type from the semiconductor substrate into the semiconductor substrate exposed through the plurality of openings.

According to another aspect of the example embodiments, there is provided a method for fabricating a nonvolatile memory device, the method including forming a stacked structure of alternating interlayer dielectric layers and sacrificial layers on a semiconductor substrate, forming at least one semiconductor pattern through the stacked structure, forming an opening through the stacked structure adjacent to the at least one semiconductor pattern, filling the opening with a metal, and annealing the stacked structure with the metal, such that metal particles of the metal in the opening substitute particles in the sacrificial layer to form conductive layers alternating with the interlayer dielectric layers.

According to still another aspect of the example embodiments, there is provided a method for fabricating a nonvolatile memory device, the method including alternately stacking a plurality of interlayer dielectric layers and a plurality of silicon layers on a semiconductor substrate in a first direction parallel to the semiconductor substrate, forming a plurality of semiconductor patterns in a second direction perpendicular to the semiconductor substrate by patterning the stacked plurality of interlayer dielectric layers and the plurality of silicon layers, forming an upper insulation layer on the stacked plurality of interlayer dielectric layer, the plurality of silicon layers, and the plurality of semiconductor patterns, forming a plurality of openings extending in parallel in the first direction by patterning the plurality of interlayer dielectric layers, the plurality of silicon layers, and the upper insulation layer, such that portions of the semiconductor substrate are exposed, implanting impurity having a different conductivity type from the semiconductor substrate into the semiconductor substrate exposed through the plurality of openings, filling the plurality of openings with aluminum, such that the aluminum forms a plurality of interfaces with the silicon layers, and annealing the semiconductor substrate at a temperature in a range of about 350° C. to about 400° C. for about one hour.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
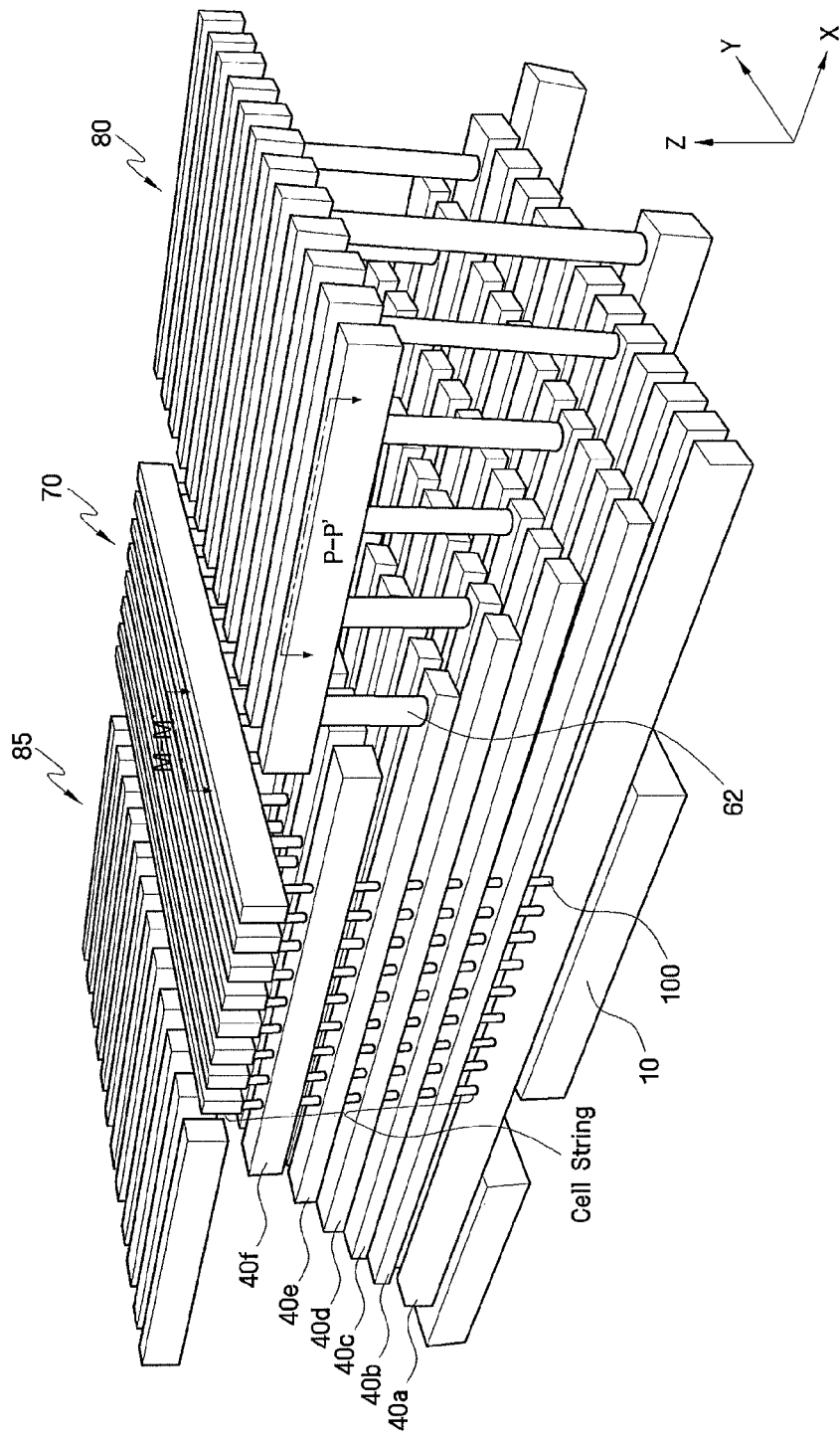
FIG. 1 illustrates a perspective view of a nonvolatile memory device according to example embodiments.

Advantages and features of the example embodiments and methods of accomplishing the same may be understood more readily by reference to the following detailed description of preferred embodiments and the accompanying drawings. The example embodiments may, however, be embodied in many different forms and should not be construed as being limited to the embodiments set forth herein. Rather, these embodiments are provided so that this disclosure will be thorough and complete and will fully convey the concept of the invention to those skilled in the art, and the example embodiments will only be defined by the appended claims. Thus, in some embodiments, well-known structures and devices are not shown in order not to obscure the description of the invention with unnecessary detail. In the drawings, the thickness of layers and regions are exaggerated for clarity. Like numbers refer to like elements throughout. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, a nonvolatile memory device according to example embodiments will be described with reference to FIGS. 1 through 4.

Figure 2:
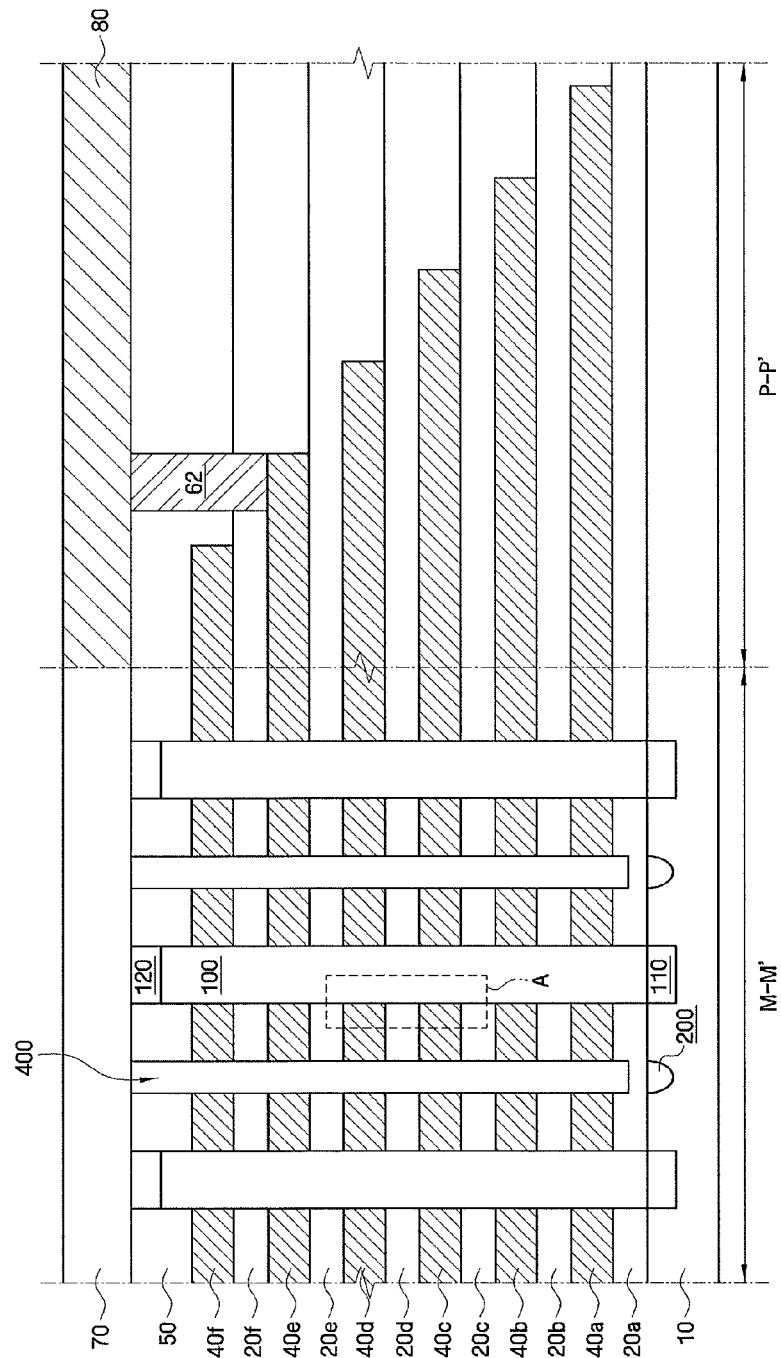
FIG. 2 illustrates a cross-sectional view taken along lines M-M' and P-P' of FIG. 1.
Figure 3:
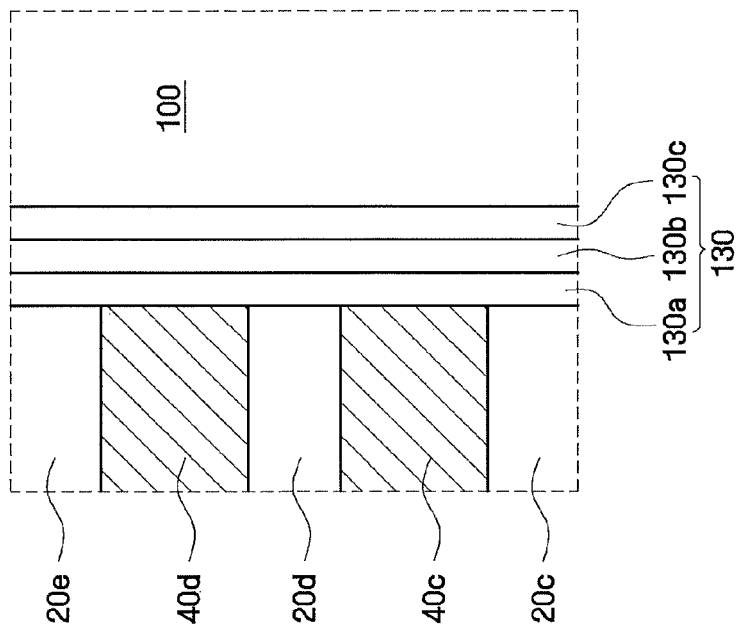
FIG. 3 illustrates an enlarged view of a portion 'A' of FIG. 2.
Figure 4:
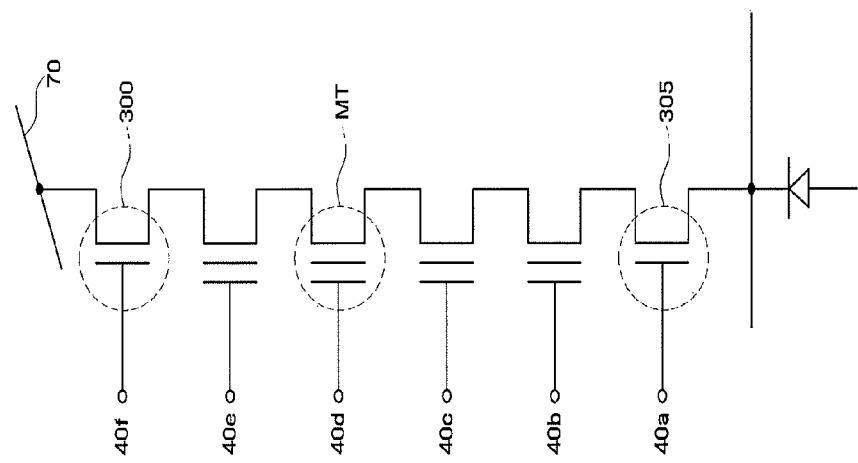
FIG. 4 illustrates a circuit diagram of a cell string according to example embodiments.

FIG. 1 illustrates a perspective view of a nonvolatile memory device according to example embodiments, FIG. 2 illustrates a cross-sectional view taken along lines M-M' and P-P' of FIG. 1, FIG. 3 illustrates an enlarged view of a portion 'A' of FIG. 2, and FIG. 4 illustrates a circuit diagram of a cell string according to example embodiments. In order to clearly show the shape of a wire, an insulation film shown in FIGS. 2 and 3 is not shown in FIG. 1.

Referring to FIGS. 1 and 2, a plurality of semiconductor patterns 100 may be formed on a semiconductor substrate 10. The semiconductor patterns 100 may be pillar-shaped and may extend in a second direction, e.g., along the Z-axis, perpendicularly to the semiconductor substrate 10. For example, the semiconductor substrate 10 and the plurality of semiconductor patterns 100 may be formed of single crystalline silicon, but aspects of the example embodiments are not limited thereto. For example, the single crystalline silicon used to form the plurality of semiconductor patterns 100 may be formed by phase-changing amorphous silicon using heat or by performing an epitaxial growth process using the semiconductor substrate 10 as a seed, but aspects of the example embodiments are not limited thereto.

The plurality of semiconductor patterns 100 may have a regular arrangement and may be formed on the semiconductor substrate 10. That is to say, the plurality of semiconductor patterns 100 may be formed at regular intervals in a first direction, e.g., along the X-axis, and in a third direction perpendicular to the first direction, e.g., along the Y-axis, as shown in FIG. 1.

A source region 110 may be formed at a junction area between the semiconductor substrate 10 and each of the semiconductor patterns 100. The source region 110 may be doped with a different conductivity type from the semiconductor substrate 10 or the semiconductor patterns 100. For example, when the semiconductor substrate 10 or the semiconductor patterns 100 is doped with a first conductivity type (for example, a P type), the source region 110 may be doped with a second conductivity type (for example, an N type). In addition, a drain region 120 may be formed on a side opposite to a side where the source region 110 is formed. The drain region 120 may also be doped with a different conductivity type from the semiconductor substrate 10 or the semiconductor patterns 100.

A common source region 200 may be formed in the semiconductor substrate 10 among the plurality of semiconductor patterns 100, e.g., one common source region 200 may be formed between every two adjacent semiconductor patterns 100. The common source region 200 may also be doped with a different conductivity type from the semiconductor substrate 10. For example, when the semiconductor substrate 10 is doped with a first conductivity type (for example, a P type), the common source region 200 may be doped with a second conductivity type (for example, N+ type).

An impurity concentration of the common source region 200 may be higher than that of the source regions 110 or the drain region 120. The common source region 200 may form a common source line CSL of a nonvolatile memory device according to example embodiments.

As illustrated in FIG. 2, first through sixth interlayer dielectric layers 20a~20f and first through sixth conductive layers 40a~40f may be formed on both sides of the plurality of semiconductor patterns 100. The first through sixth interlayer dielectric layers 20a~20f and the first through sixth conductive layers 40a~40f may be formed, e.g., alternately, in a first direction parallel to the semiconductor substrate 10 (for example, in the X-direction). As further illustrated in FIG. 2, in order to facilitate wire connection, ends of the first through sixth conductive layers 40a~40f may be formed stepwise. For example, the first conductive layer 40a, the second through fifth conductive layers 40b~40e, and the sixth conductive layer 40f may be a ground selection line GSL, word lines WL, and a string selection line SSL, respectively, of the nonvolatile memory device according to example embodiments.

The first through sixth conductive layers 40a~40f of the nonvolatile memory device according to example embodiments may be metal layers, e.g., the first through sixth conductive layers 40a~40f may be aluminum (Al) layers. In detail, the first through sixth conductive layers 40a~40f may be metal layers, e.g., Al layers, formed by substituting silicon (Si) layers with metal. Since the first through sixth conductive layers 40a~40f function as the ground selection line GSL, the word line WL, and the string selection line SSL of the nonvolatile memory device, the nonvolatile memory device may have a low resistance characteristic. That is, as the specific resistivity of Si (for example, poly-Si) is higher than that of Al, when silicon layers are substituted with metal layers to form the first through sixth conductive layers 40a~40f, resistivity of the resultant metal layers may be reduced. In other words, when the first through sixth conductive layers 40a~40f are formed of metal layers such as Al, the ground selection line GSL, the word line WL, and the string selection line SSL may have reduced resistance. As such, the nonvolatile memory device according to example embodiments may have a low resistance characteristic. A method of fabricating the first through sixth conductive layers 40a~40f will be described in more detail below with reference to FIGS. 5-13.

Referring to FIG. 3, the nonvolatile memory device according to example embodiments may include an ONO layer 130 between the semiconductor patterns 100 and each of the first through sixth interlayer dielectric layers 20a~20f and the first through sixth conductive layers 40a~40f. In detail, the ONO layer 130 may be formed, conformally, along surfaces of the semiconductor patterns 100, so a portion of the ONO layer 103 may be separate between each semiconductor pattern 100 nad its respective six interlayer dielectric layers 20a~20f and six conductive layers 40a~40f. The ONO layer 130 may include a first oxide layer 130a, a nitride layer 130b, and a second oxide layer 130c on lateral surfaces of the first through sixth interlayer dielectric layers 20a~20f and the first through sixth conductive layers 40a~40f. For example, when the third conductive layer 40c and the fourth conductive layer 40d function as control gates, the first oxide layer 130a may function as a blocking layer, the nitride layer 130b may function as a floating gate, and the second oxide layer 130c may function as a tunneling layer, which will be described in more detail with reference to FIGS. 1, 2, and 4.

The semiconductors patterns 100 may include, e.g., define, cells strings having a plurality of cell transistors. The cell transistors constituting one cell string in the semiconductor pattern 100 may be connected in series in the second direction (for example, in the Z-direction). For example, as illustrated in FIG. 4, the cell transistors may include memory transistors MT and select transistors 300 and 305. The memory transistors MT may be data storage transistors that store charges in each floating gate, and the select transistors 300 and 305 may include a string select transistor 300 that selects a string and a ground select transistor 305 that selects a ground line. The semiconductor patterns 100 may serve as channels for the memory transistors MT and the select transistors 300 and 305.

Referring again to FIG. 4, the first conductive layer 40a may be a ground selection line GSL and may be connected to a gate of the ground select transistor 305. The second through fifth conductive layers 40b~40e may be word lines WL and may function as control gates of the memory transistors MT. In the illustrated embodiment, four word lines WL are illustrated, but aspects of the example embodiments are not limited thereto. The number of word lines WL may be increased or decreased, as needed. Finally, the sixth conductive layer 40f may be a string selection line SSL and may be connected to a gate of the string select transistor 300. Meanwhile, the memory transistors MT and the select transistors 300 and 305 may be connected in series to bit lines 70 to be described later, as shown in FIG. 4. For example, the nonvolatile memory device fabricated according to example embodiments may be a vertical NAND flash memory device including semiconductor patterns 100 vertically extending from the semiconductor substrate 10, cell transistors MT, 300, and 305 using the semiconductor patterns 100 as channels, and the bit lines 70 electrically connected to the semiconductor patterns 100.

Referring back to FIGS. 1 and 2, an upper insulation layer 50 may be formed on the first through sixth interlayer dielectric layers 20a~20f and the first through sixth conductive layers 40a~40f. A plurality of openings 400 may be formed in the upper insulation layer 50. The plurality of openings 400 may extend through the first through sixth conductive layers 40a~40f, so that the first through sixth conductive layers 40a~40f may not extend in the third direction (for example, in the Y-direction).

The bit lines 70 may be formed to extend in parallel in a third direction (for example, in the Y-direction). The bit lines 70 may be directly connected to the semiconductor patterns 100, as shown in FIGS. 1 and 2. Alternatively, a bit line contact (not shown) may be separately formed to be connected to the semiconductor patterns 100.

A first wiring 80 may be connected to first through fifth conductive layers 40a~40e through a first wiring contact 62. In addition, the sixth conductive layer 40f may be connected to a second wiring 85 through a second wiring contact (not shown).

Next, methods for fabricating nonvolatile memory devices according to an embodiment of the inventive concept and modified embodiments thereof will be described with reference to FIGS. 5 through 13.

FIGS. 5 through 13 illustrate stages in a fabrication method of nonvolatile memory devices according to an embodiment. Although the exemplary nonvolatile memory device is described by way of example assuming that a cell string includes four word lines WL, aspects of the example embodiments are not limited thereto.

Figure 5:
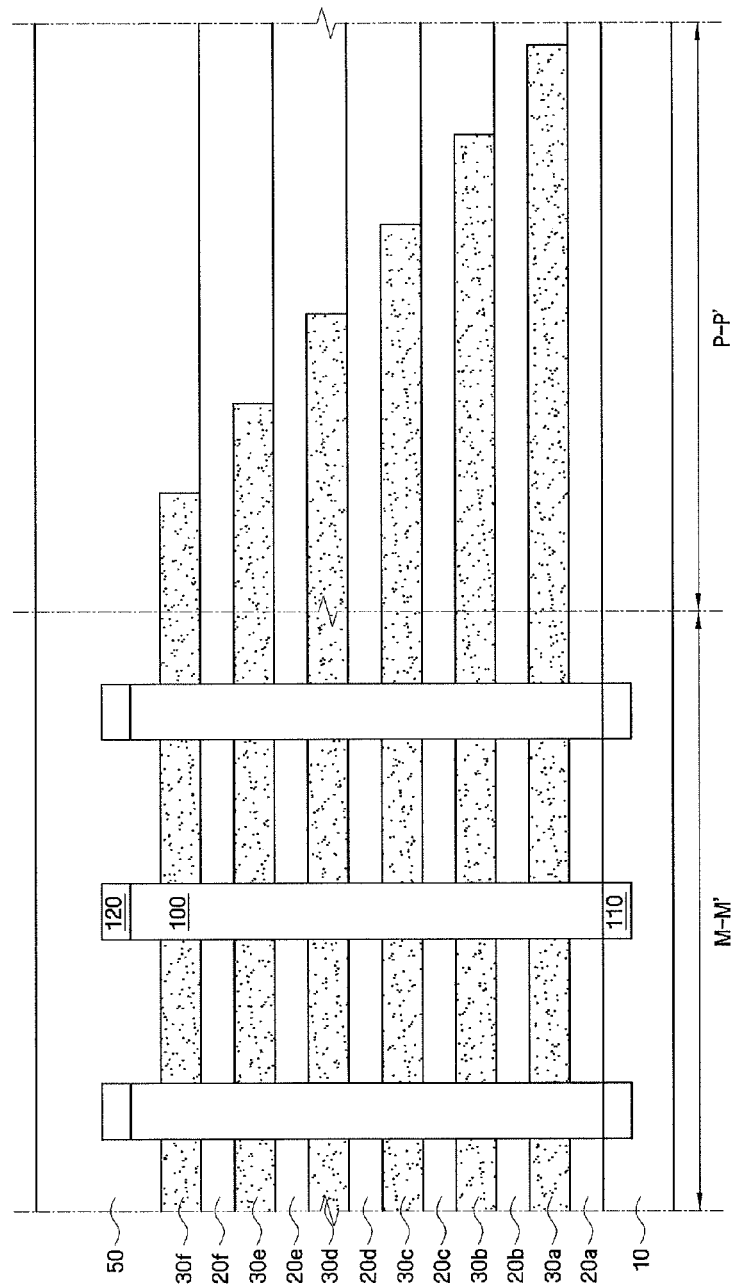
FIGS. 5 through 13 illustrate intermediate process steps in a method for fabricating a nonvolatile memory device according to example embodiments.

Referring first to FIGS. 1 and 5, a plurality of interlayer dielectric layers, a plurality of sacrificial layers, and a plurality of semiconductor patterns may be formed on a semiconductor substrate 10. In detail, the first through sixth interlayer dielectric layers 20a~20f and the first through sixth sacrificial layers 30a~30f may be alternately stacked on the semiconductor substrate 10 in the first direction (for example, in the X-direction). As shown in FIG. 5, in order to facilitate wire connection, ends of the first through sixth sacrificial layers 30a~30f may be formed stepwise. Next, a plurality of channel holes (not shown) may be formed by patterning the first through sixth interlayer dielectric layers 20a~20f and the first through sixth sacrificial layers 30a~30f. In addition, the ONO layer (130 of FIG. 3) and the semiconductor patterns 100 may be formed in the channel holes (not shown) in the second direction (for example, in the Z-direction). For example, the respective semiconductor patterns 100 may include single crystalline silicon, but aspects of the example embodiments are not limited thereto. In addition, the single crystalline silicon may be, for example, formed by filling amorphous silicon in the channel holes and phase-changing the amorphous silicon using heat or by performing an epitaxial growth process using the semiconductor substrate 10 as a seed, but aspects of the example embodiments are not limited thereto. After forming the plurality of semiconductor patterns 100 in the above-described manner, the upper insulation layer 50 may be formed on the first through sixth interlayer dielectric layers 20a~20f, the first through sixth sacrificial layers 30a~30f, and the plurality of semiconductor patterns 100.

Figure 6:
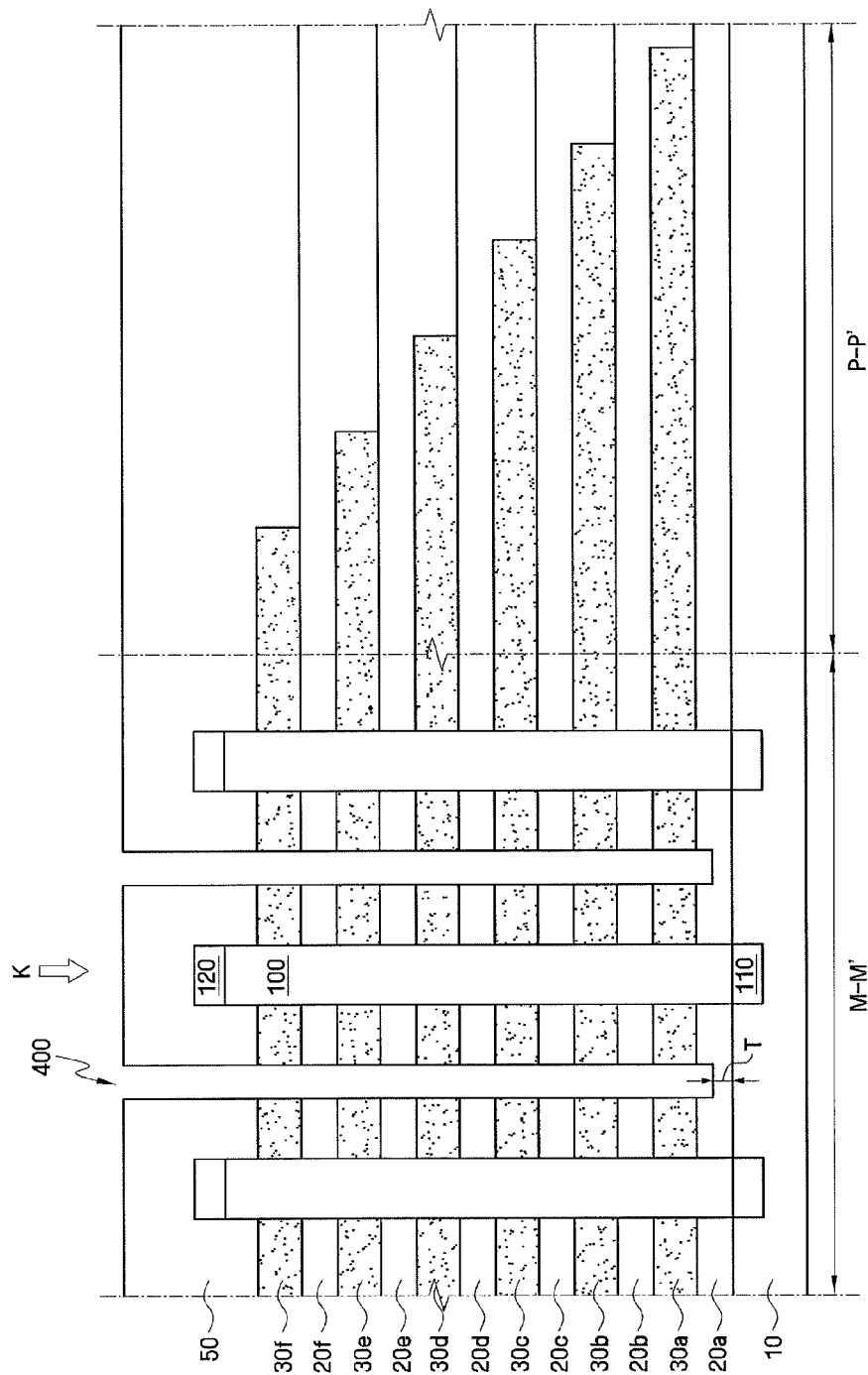

Next, referring to FIG. 6, the plurality of openings 400 may be formed by patterning the upper insulation layer 50, the first through sixth interlayer dielectric layers 20a~20f, and the first through sixth sacrificial layers 30a~30f. For example, each opening 400 may extend between two adjacent semiconductor patterns 100, and may have sufficient depth to overlap at least a portion of the first interlayer dielectric layer 20a, e.g., an upper portion of the first interlayer dielectric layer 20a may be removed when forming the opening 400 to have a bottom portion of the first interlayer dielectric layer 20a remain on the semiconductor substrate 10. For example, a thickness T of the remaining first interlayer dielectric layer 20a may be in a range of about 2 nm to about 5 nm. The remaining portion of the first interlayer dielectric layer 20a may serve as a protection layer for preventing metal (e.g., Al) from penetrating into the semiconductor substrate 10 during a subsequent deposition of metal into the openings 400, i.e., during formation of the metal layer 40, which will later be described.

Figure 7:
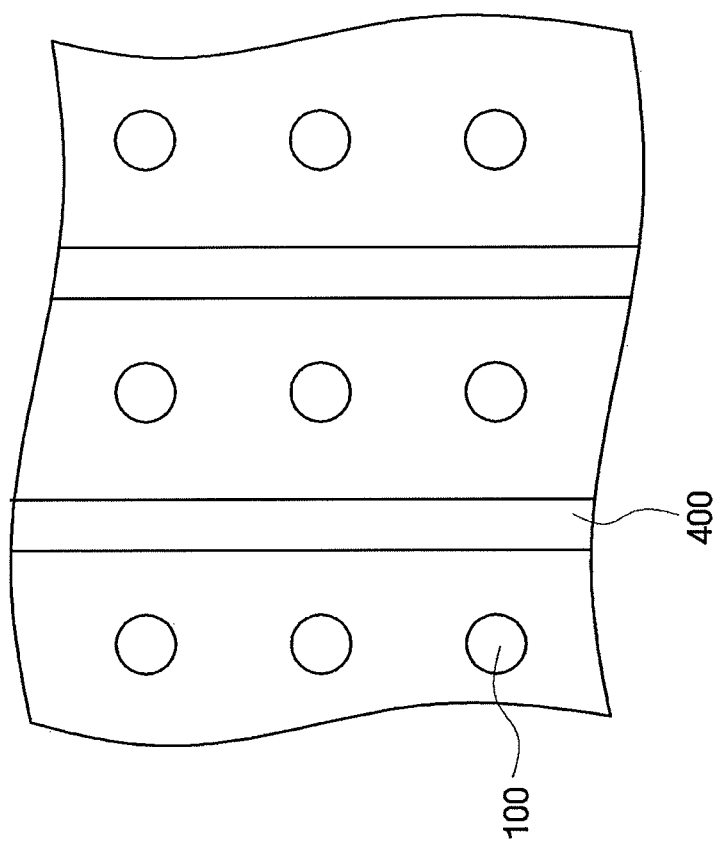
Figure 8:
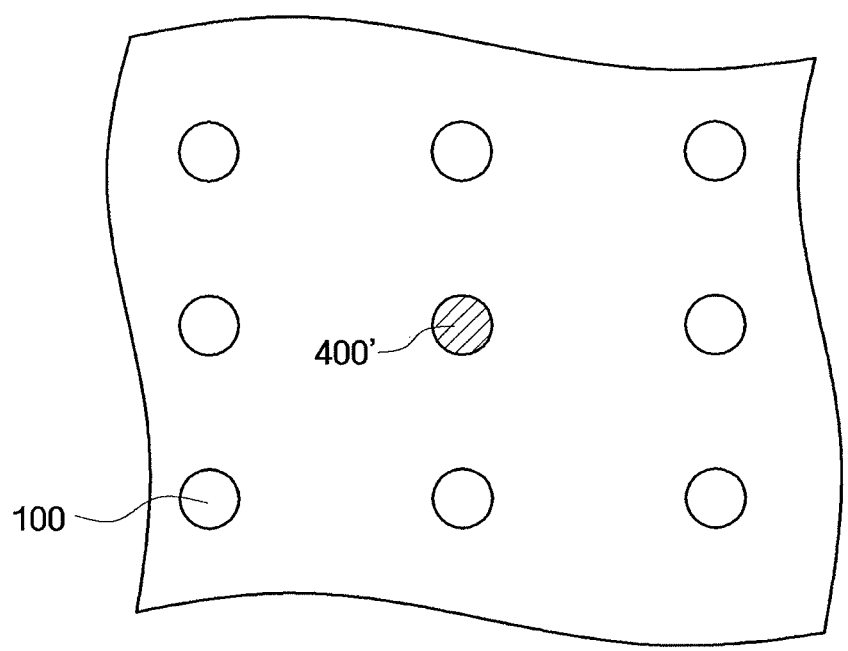
Figure 9:
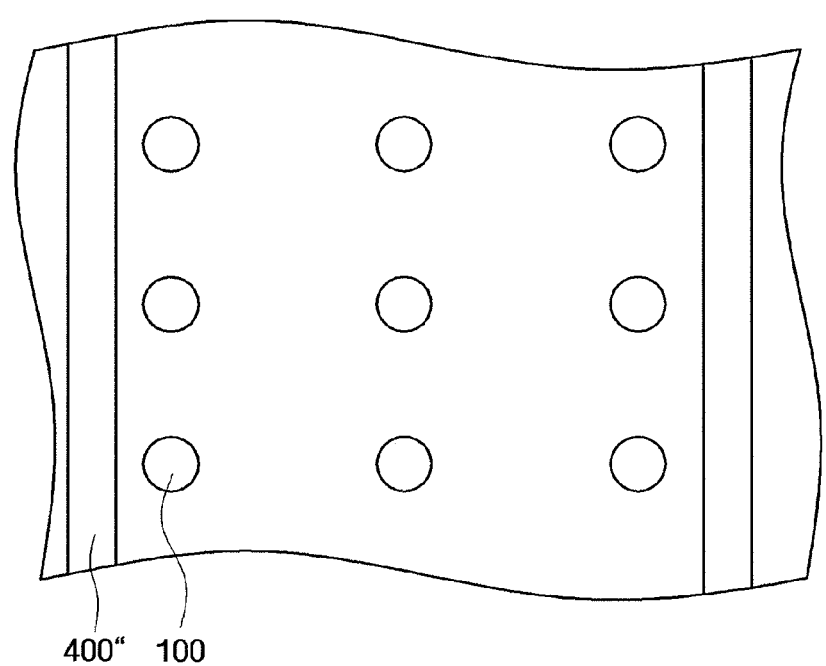

Formation of the plurality of openings 400 may be practiced through various embodiments, which will be described in more detail with reference to FIGS. 7 through 9. FIGS. 7 through 9 illustrate plan views of opening formation, viewed in a direction indicated by reference character K.

Referring first to FIG. 7, in the method for fabricating the nonvolatile memory device according to an embodiment, the plurality of openings 400 may be formed to extend between rows of semiconductor patterns 100 in a first direction (for example, in an X-direction). That is to say, the plurality of openings 400 may extend in the X-axis direction along an entire width of the semiconductor substrate 10 and to a predetermined depth in the Z-axis direction through the first through sixth sacrificial layers 30a~30. As the plurality of openings 400 may extend along an entire width of the semiconductor substrate 10, the first through sixth sacrificial layers 30a~30f may be separated into stripes along the X-axis, i.e., the stripes of first through sixth sacrificial layers 30a~30f may be discontinuous, i.e., may not extend, in the Y-axis direction.

Referring to FIG. 8, in the method for fabricating the nonvolatile memory device according to a modified embodiment, the plurality of openings 400 may be formed between each of the plurality of semiconductor patterns 100, wherein a top surface of each of the plurality of the openings 400' has the same shape as that of each of the plurality of semiconductor patterns 100. In this case, the openings 400' may be dummy semiconductor patterns 100, and the first through sixth sacrificial layers 30a~30f may be formed to extend in the third direction (for example, in the Y-direction). In other words, each opening 400' may extend in the Z direction and have a substantially same shape, e.g., pillar, as the semiconductors patterns 100. As illustrated in FIG. 8, one opening 400' may be surrounded by a plurality of semiconductor patterns 100, as viewed from a plan view.

Referring to FIG. 9, in the method for fabricating the nonvolatile memory device according to another modified embodiment, the plurality of openings 400'' may not be formed between each of the plurality of semiconductor patterns 100 but at both ends of the semiconductor substrate 10 in a first direction (for example, in an X-direction). In other words, the plurality of openings 400'' may extend in the X and Z directions, e.g., only, at edges of the semiconductor substrate 10.

Figure 10:
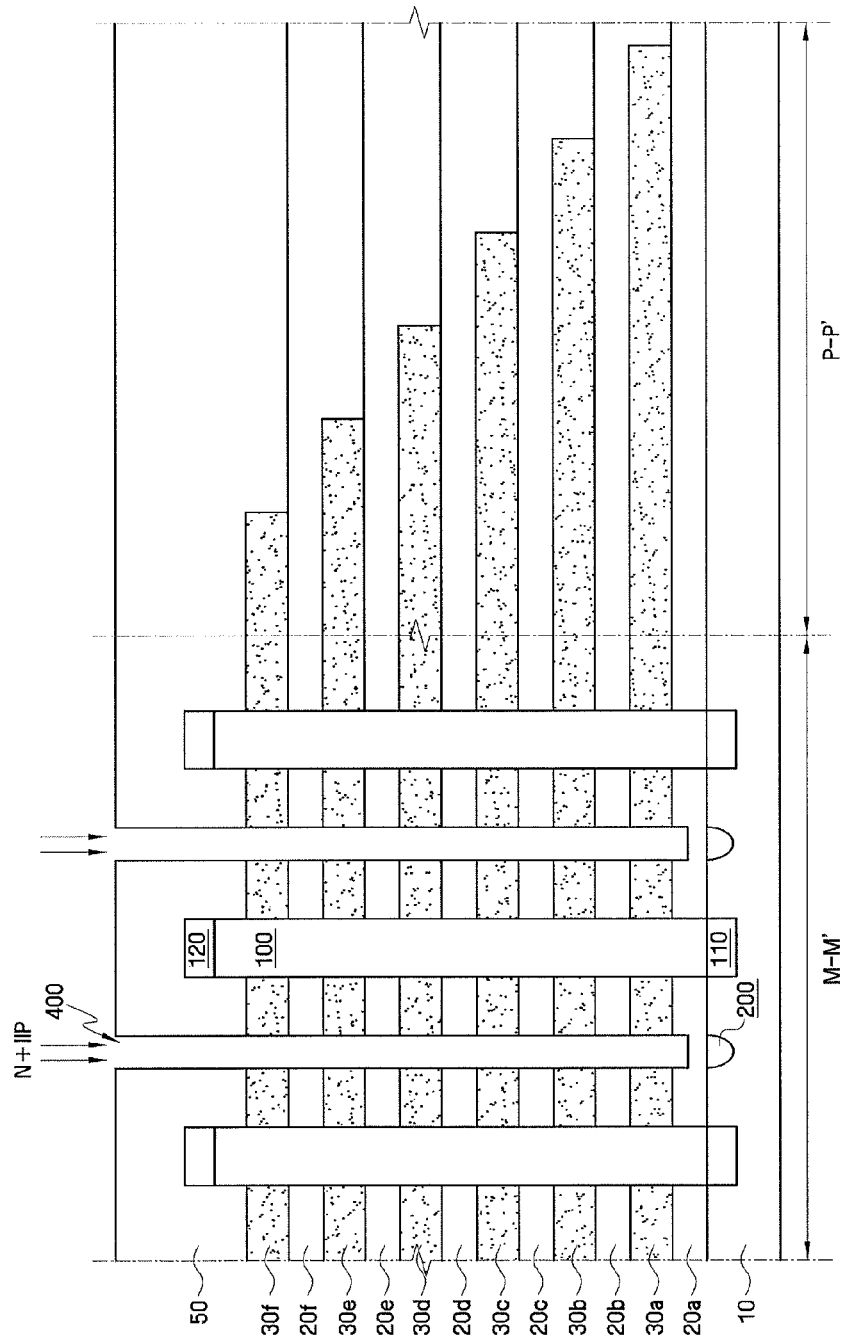

Next, referring to FIG. 10, an impurity having a different conductivity type from the semiconductor substrate 10 is implanted into the semiconductor substrate 10 exposed through the plurality of openings 40. For example, when the semiconductor substrate 10 is doped with an impurity having a first conductivity type, e.g., P type impurity such as As, with an energy of about 30 KeV, the common source region 200 of a second conductivity type (for example, N+ type) may be formed in the semiconductor substrate 10 through the openings 400. As discussed above, the common source region 200 may constitute a common source line CSL.

Figure 11:
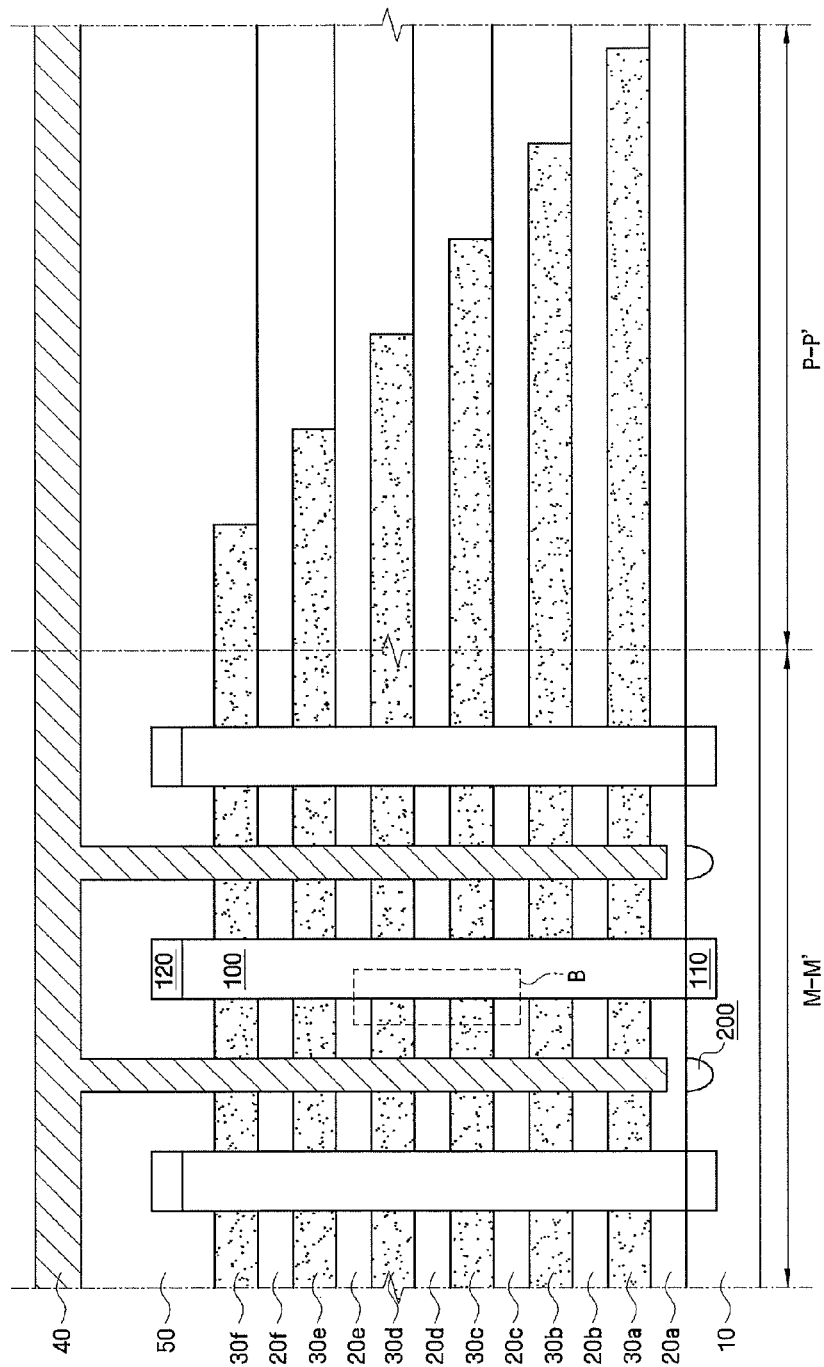
Figure 12:
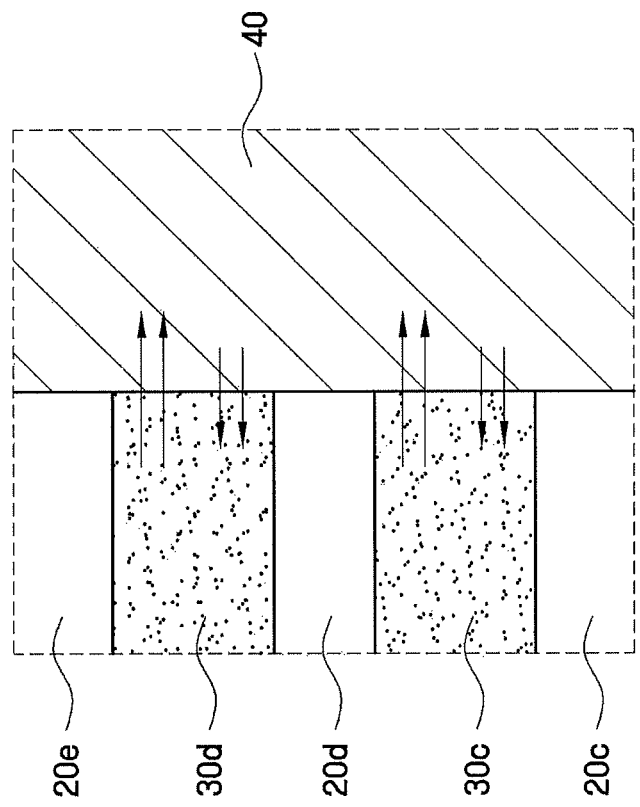

Next, referring to FIGS. 11 and 12, a metal layer 40 may be formed on the upper insulation layer 50. FIG. 12 is an enlarged view of a portion "B" of FIG. 11.

In detail, the metal layer 40 may be formed on the upper insulation layer 50 to fill, e.g., completely fill, the plurality of openings 400. In further detail, the plurality of openings 400 may be filled with the metal layer 40, such that the metal layer 40 in the openings 400 may contact, e.g., directly contact, each of the first through sixth sacrificial layers 30a~30f, i.e., to form interfaces at junction areas between the metal layer 40 and each of the first through sixth sacrificial layers 30a~30f.

Next, the semiconductor substrate 10 may be annealed at a temperature in a range of about 350° C. to about 400° C. for about one hour. As a result of the annealing and without intending to be bound by htoery, particles, e.g., Si particles, contained in the first through sixth sacrificial layers 30a~30f may be substituted by metal particles, e.g., Al particles, from the metal layer 40, as will be described in more detail below with reference to FIG. 12.

Referring to FIG. 12, when the semiconductor substrate 10 is annealed in the above-described manner, a diffusion speed of Si particles in the first through sixth sacrificial layers 30a~30f is about 3 times higher than that of Al particles in the metal layer 40. Accordingly, Si particles move faster toward the metal layer 40 than Al particles, thereby creating vacancies in the first through sixth sacrificial layers 30a~30f. Al particles, which are relatively slow in view of the diffusion speed, fill the vacancies in the first through sixth sacrificial layers 30a~30f. As the annealing continuously proceeds, a large number of Si particles diffuse from the first through sixth sacrificial layers 30a~30f, while the vacancies in the first through sixth sacrificial layers 30a~30f are filled with Al particles. When the diffusion is completed, the first through sixth sacrificial layers 30a~30f with the Si vacancies are filled with metal particles, such that the first through sixth sacrificial layers 30a~30f with the Si vacancies are converted into first through sixth conductive layers 40a~40f including Al particles in the Si vacancies.

Figure 13:
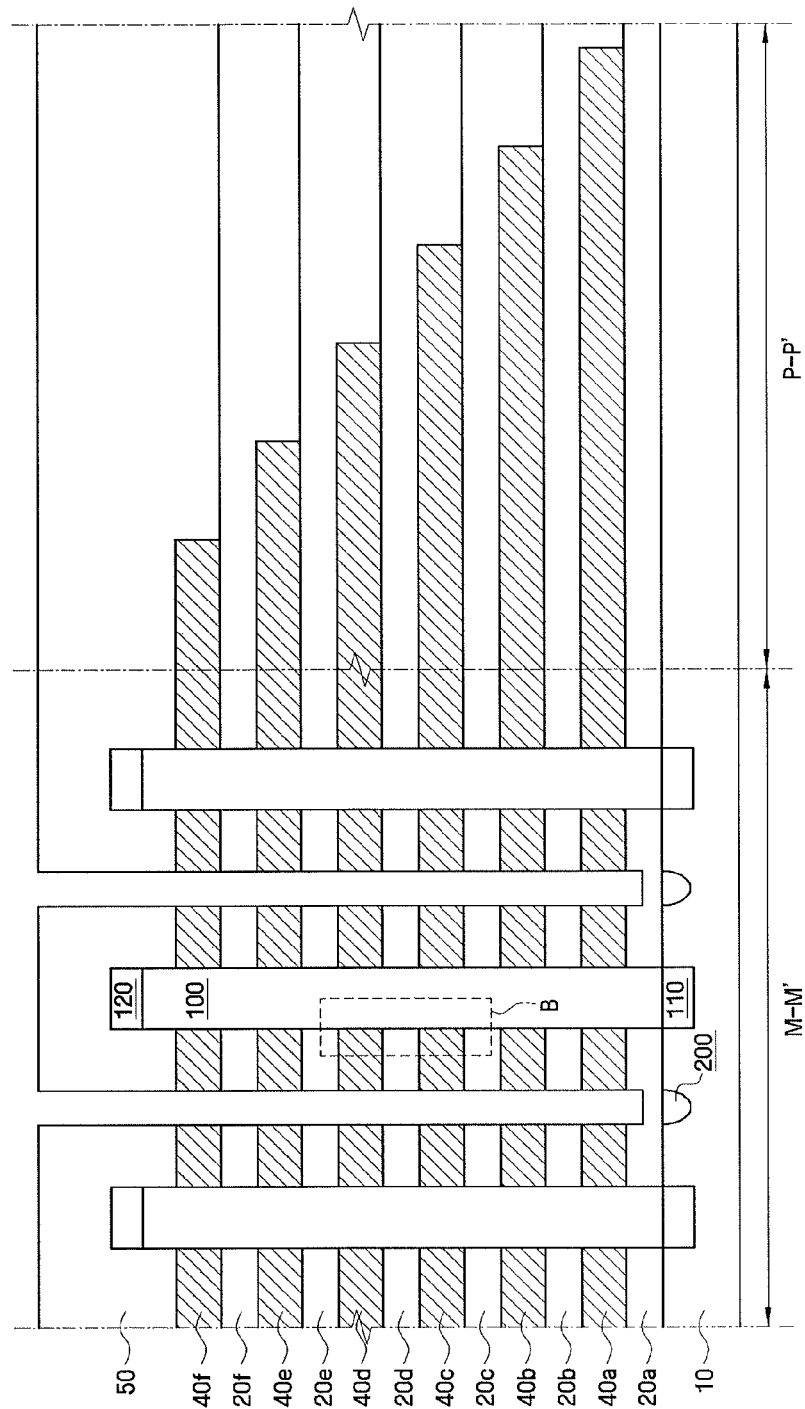

Referring to FIG. 13, the metal layer 40 including the substituted Si particles is removed. Thereafter, the upper insulation layer 50 is planarized to form a first wiring contact 62, and bit lines 70 and a first wiring 80 are formed on the upper insulation layer 50, thereby fabricating the nonvolatile memory device shown in FIGS. 1 and 2.

Figure 14:
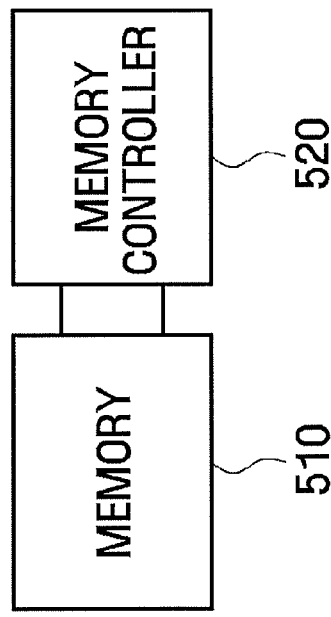
FIGS. 14 through 16 illustrate examples of systems including a nonvolatile memory device according to example embodiments.
Figure 15:
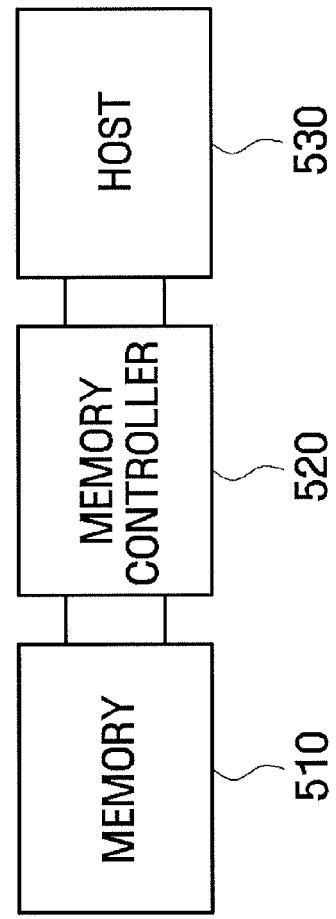
Figure 16:
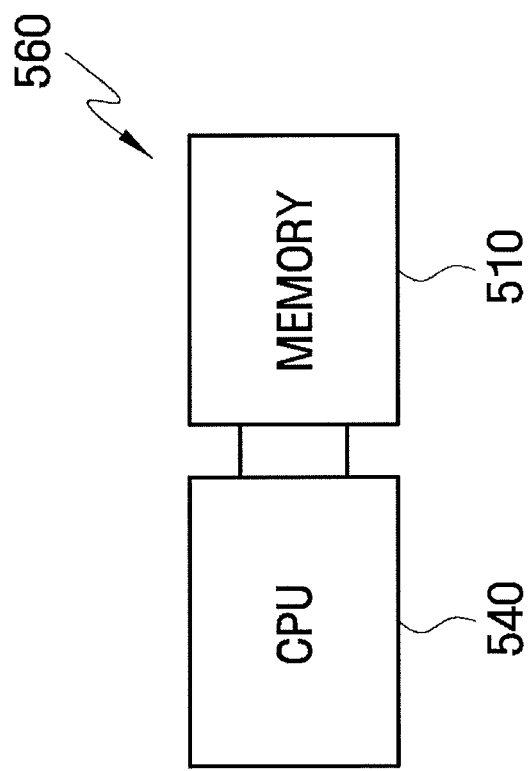

Next, exemplary systems incorporating a nonvolatile memory device fabricated according to an embodiment will be described with reference to FIGS. 14 through 16. FIGS. 14 through 16 illustrate diagrams of general systems incorporating a nonvolatile memory device according to an example embodiment.

Referring to FIG. 14, a system may include a memory 510 and a memory controller 520 connected to the memory 510. Here, the memory 510 may be a nonvolatile memory device fabricated according to an exemplary embodiment, and the memory controller 520 may provide input signals which controls operations of the memory 510. For example, the memory controller 520 may provide the memory 510 with command signals which control read/write operations and address signals.

A system containing such memory 510 and the memory controller 520 may be embodied into a card, e.g., a memory card. For example, the system according to example embodiments may be embodied into an industry standard card used in electronics devices, e.g., cellular phones, two-way communication systems, one way pagers, two-way pagers, personal communication systems, portable computers, personal data assistances (PDAs), audio and/or video players, digital and/or video cameras, navigation systems, global positioning systems (GPS), etc. However, it is not limited thereto, and the system according to the exemplary embodiment may be embodied into other various devices, e.g., memory sticks.

Referring to FIG. 15, another system may include the memory 510, the memory controller 520, and a host system 530. Here, the host system 530 may be connected to the memory controller 520 through a bus and may provide the memory controller 520 with a control signal to allow the memory controller 520 to control operations of the memory 510. Such host system 530 can be a processing system used in, e.g., cellular phones, two-way communication systems, one way pagers, two-way pagers, personal communication systems, portable computers, PDAs, audio and/or video players, digital and/or video cameras, navigation systems, and GPS. Meanwhile, in FIG. 15, although the memory controller 520 is interposed between the memory 510 and the host system 530, aspects of the example embodiments are not limited thereto. In other embodiments, the memory controller 520 may be selectively omitted.

Referring to FIG. 16, yet another system may include a computer system 560 including a Central Processing Unit (CPU) 540 and the memory 510. In the computer system 560, the memory 510 may be connected to the CPU 540 directly or through a typical computer bus architecture, and may stores an Operating System (OS) instruction set, a Basic Input/Output Start up (BIOS) instruction set, and an Advanced Configuration and Power Interface (ACPI) instruction set. Also, the memory 510 may be used as a mass storage device, e.g., a Solid State Disk (SSD).

For brevity, although all components of the computer system 560 are not illustrated in FIG. 16, aspects of the example embodiments are not limited thereto. In addition, in FIG. 16, the memory controller 520 is not shown between the memory 510 and the CPU 540, for the sake of explanation. However, in alternative embodiments of the inventive concept, the memory controller 520 may be provided between the memory 510 and the CPU 540.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A method for fabricating a cell string, the method comprising:
    forming an interlayer dielectric layer, a sacrificial layer, and a semiconductor pattern on a semiconductor substrate, such that the interlayer dielectric layer and the sacrificial layer are formed in a first direction parallel with the semiconductor substrate, and such that the semiconductor pattern is formed in a second direction perpendicular to the semiconductor substrate;
    forming an opening by patterning the interlayer dielectric layer and the sacrificial layer;
    filling the opening with a metal, such that the metal contacts the sacrificial layer to form an interface between the metal and the sacrificial layer; and
    annealing the semiconductor pattern having the opening filled with the metal.

2. The method as claimed in claim 1, wherein during annealing a diffusion speed of particles in the sacrificial layer at the interface is higher than that of particles in the metal.

3. The method as claimed in claim 2, wherein forming the sacrificial layer includes depositing a material including a silicon (Si) layer, and filling the opening with metal includes depositing aluminum (Al) in the opening.

4. The method as claimed in claim 1, wherein annealing includes annealing the semiconductor substrate at a temperature in a range of about 350° C. to about 400° C. for about one hour.

5. The method as claimed in claim 4, wherein the annealing includes heating the sacrificial layer and the metal in the opening, such that particles in the sacrificial layer are substituted with metal particles of the metal.

6. The method as claimed in claim 1, wherein forming the interlayer dielectric layer, the sacrificial layer, and the semiconductor pattern includes:
    sequentially stacking a first interlayer dielectric layer, the sacrificial layer, and a second interlayer dielectric layer on the semiconductor substrate in the first direction; and
    forming the semiconductor pattern in the second direction by patterning the stacked first interlayer dielectric layer, the sacrificial layer, and the second interlayer dielectric layer.

7. The method as claimed in claim 6, wherein forming the semiconductor pattern includes:
forming channel holes by patterning the stacked first interlayer dielectric layer, sacrificial layer, and second interlayer dielectric layer; and
forming an ONO layer and the semiconductor pattern in the channel holes.

8. A method for fabricating a cell string, the method comprising:
forming an interlayer dielectric layer, a sacrificial layer, and a semiconductor pattern on a semiconductor substrate, such that the interlayer dielectric layer and the sacrificial layer are formed in a first direction parallel with the semiconductor substrate, and such that the semiconductor pattern is formed in a second direction perpendicular to the semiconductor substrate, wherein forming the interlayer dielectric layer, the sacrificial layer, and the semiconductor pattern includes forming a plurality of interlayer dielectric layers, a plurality of sacrificial layers, and a plurality of semiconductor patterns on the semiconductor substrate;
forming an opening by patterning the interlayer dielectric layer and the sacrificial layer, wherein forming the opening includes forming a plurality of openings by patterning the plurality of interlayer dielectric layers and the plurality of sacrificial layers;
filling the opening with a metal without removing the sacrificial layer; and
annealing the semiconductor pattern having the opening filled with the metal.

9. The method as claimed in claim 8, wherein filling the opening includes filling the plurality of openings with metal to form a plurality of interfaces between the metal and the plurality of sacrificial layers.

10. The method as claimed in claim 9, wherein forming the plurality of sacrificial layers includes forming a plurality of silicon layers, and filling the openings with metal includes filling the openings with aluminum.

11. The method as claimed in claim 10, wherein forming the plurality of interfaces includes forming the aluminum in direct contact with the silicon layers.

12. The method as claimed in claim 8, wherein the annealing includes annealing the semiconductor substrate at a temperature in a range of about 350° C. to about 400° C. for about one hour.

13. The method as claimed in claim 8, wherein forming the plurality of openings includes patterning the plurality of interlayer dielectric layers and the plurality of sacrificial layers stacked between the plurality of semiconductor patterns.

14. The method as claimed in claim 13, wherein forming the plurality of openings includes forming openings that extend in parallel in the first direction.

15. The method as claimed in claim 13, wherein forming the plurality of openings includes forming a top surface of each of the plurality of the openings to have a same shape as that of each of the plurality of semiconductor patterns.

16. The method as claimed in claim 8, further comprising forming an upper insulation layer on the stacked plurality of interlayer dielectric layers, the plurality of sacrificial layers, and the plurality of semiconductor patterns, and
wherein forming the plurality of openings includes forming the plurality of openings by patterning the plurality of interlayer dielectric layers, the plurality of sacrificial layers, and the plurality of semiconductor patterns.

17. The method as claimed in claim 16, further comprising implanting an impurity having a different conductivity type from the semiconductor substrate into the semiconductor substrate exposed through the plurality of openings.

18. A method for fabricating a cell string, the method comprising:
forming an interlayer dielectric layer, a sacrificial layer, and a semiconductor pattern on a semiconductor substrate, such that the interlayer dielectric layer and the sacrificial layer are formed in a first direction parallel with the semiconductor substrate, and such that the semiconductor pattern is formed in a second direction perpendicular to the semiconductor substrate;
forming an opening by patterning the interlayer dielectric layer and the sacrificial layer;
filling the opening with a metal; and
annealing the semiconductor pattern having the opening filled with the metal,
wherein the annealing includes heating the sacrificial layer and the metal in the opening, such that particles in the sacrificial layer are substituted with metal particles of the metal.

* * * * *